United States Patent [19]
Nadd

[11] Patent Number: 5,592,117
[45] Date of Patent: Jan. 7, 1997

[54] INTEGRATED MOSGATED POWER SEMICONDUCTOR DEVICE WITH HIGH NEGATIVE CLAMP VOLTAGE AND FAIL SAFE OPERATION

[75] Inventor: Bruno C. Nadd, Puyvert, France

[73] Assignee: International Rectifier Corporation, El Segundo, Calif.

[21] Appl. No.: 420,194

[22] Filed: Apr. 11, 1995

[51] Int. Cl.[6] ................................................. H03K 17/04
[52] U.S. Cl. ........................... 327/374; 327/365; 327/377; 327/427
[58] Field of Search ....................................... 327/108, 110, 327/318, 328, 365, 374, 376, 377, 379, 419, 427

[56] References Cited

U.S. PATENT DOCUMENTS

| | | | |
|---|---|---|---|
| 4,691,129 | 9/1987 | Einzinger et al. | 307/581 |
| 4,952,827 | 8/1990 | Leipold et al. | 307/571 |
| 5,142,171 | 8/1992 | Nunogawa et al. | 307/565 |
| 5,371,418 | 12/1994 | Leipold et al. | 327/109 |
| 5,446,406 | 8/1995 | Gantioler et al. | 327/427 |
| 5,467,047 | 12/1995 | Robb | 327/377 |

FOREIGN PATENT DOCUMENTS

| | | |
|---|---|---|
| 0602708 | of 1994 | European Pat. Off. . |
| 4403201 | of 1994 | Germany . |

Primary Examiner—Timothy P. Callahan
Assistant Examiner—Jeffrey Zweizig
Attorney, Agent, or Firm—Ostrolenk, Faber, Gerb & Soffen, LLP

[57] ABSTRACT

A high side switch having a MOSgated power device has a control circuit which contains a control MOSFET which is connected between the gate and source of the MOSgated power device. The input signal to turn the power device on and off is connected to a level translator circuit which is, in turn, connected to an inverter circuit which drives the gate of the control MOSFET. The control MOSFET then prevents the turn on of the power MOSFET during the turn-off process. A high negative clamp voltage causes a higher di/dt reduction of current during turn off to shorten the turn-off time. The power MOS device cannot be turned on whenever $V_{CC}$ is low and the output voltage is negative.

11 Claims, 4 Drawing Sheets

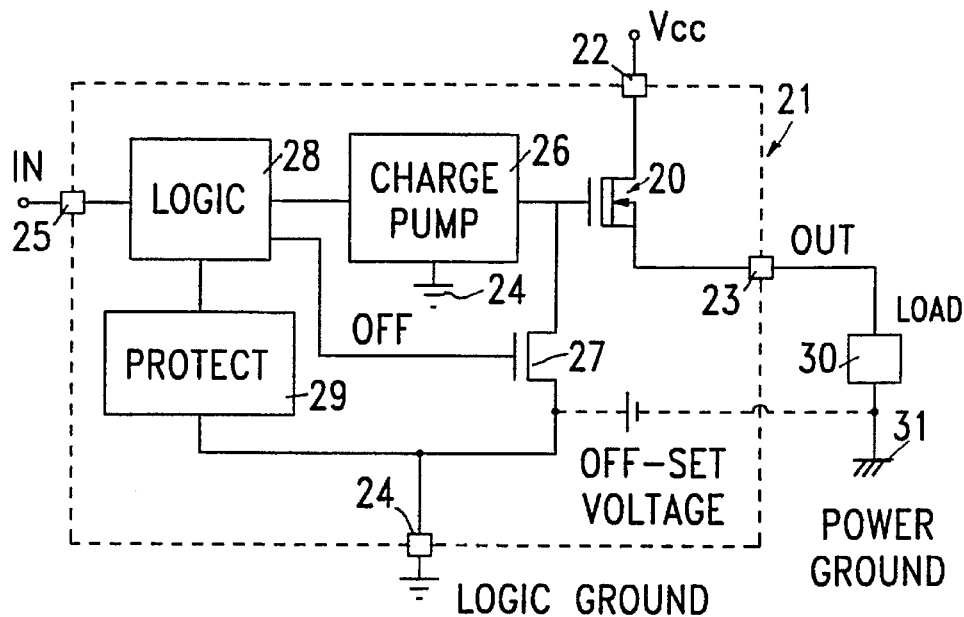
FIG. 1
PRIOR ART
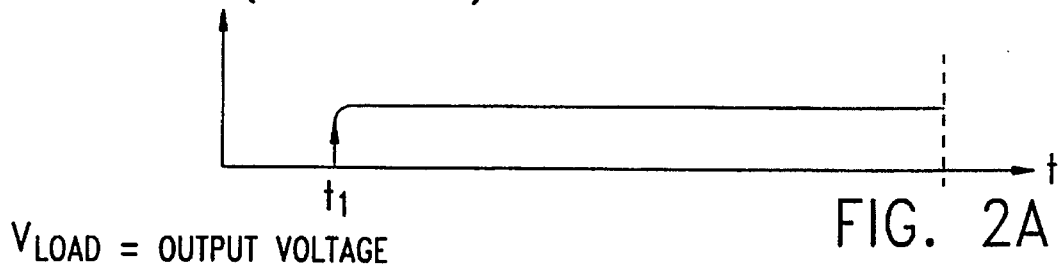
FIG. 2A
FIG. 2B
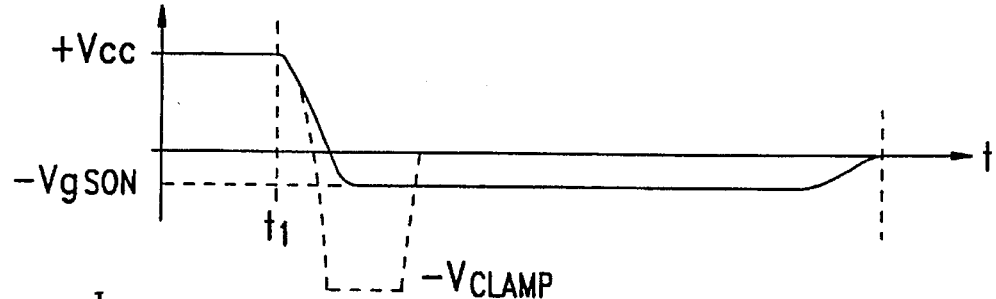
FIG. 2C

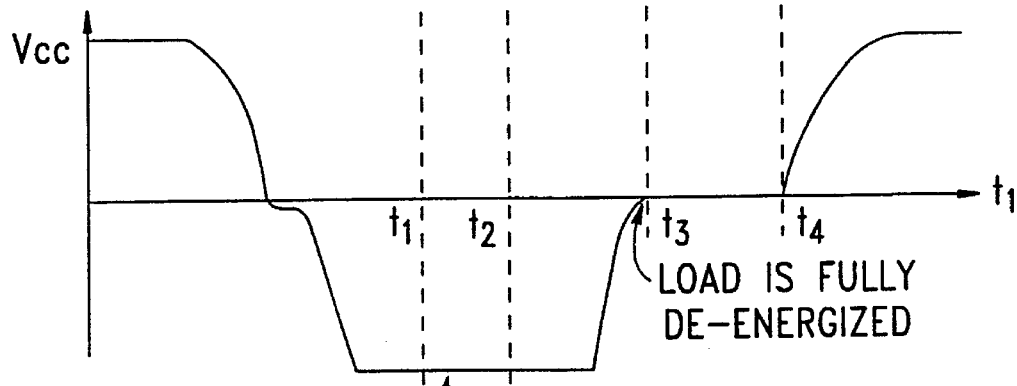
FIG. 5A
FIG. 5B
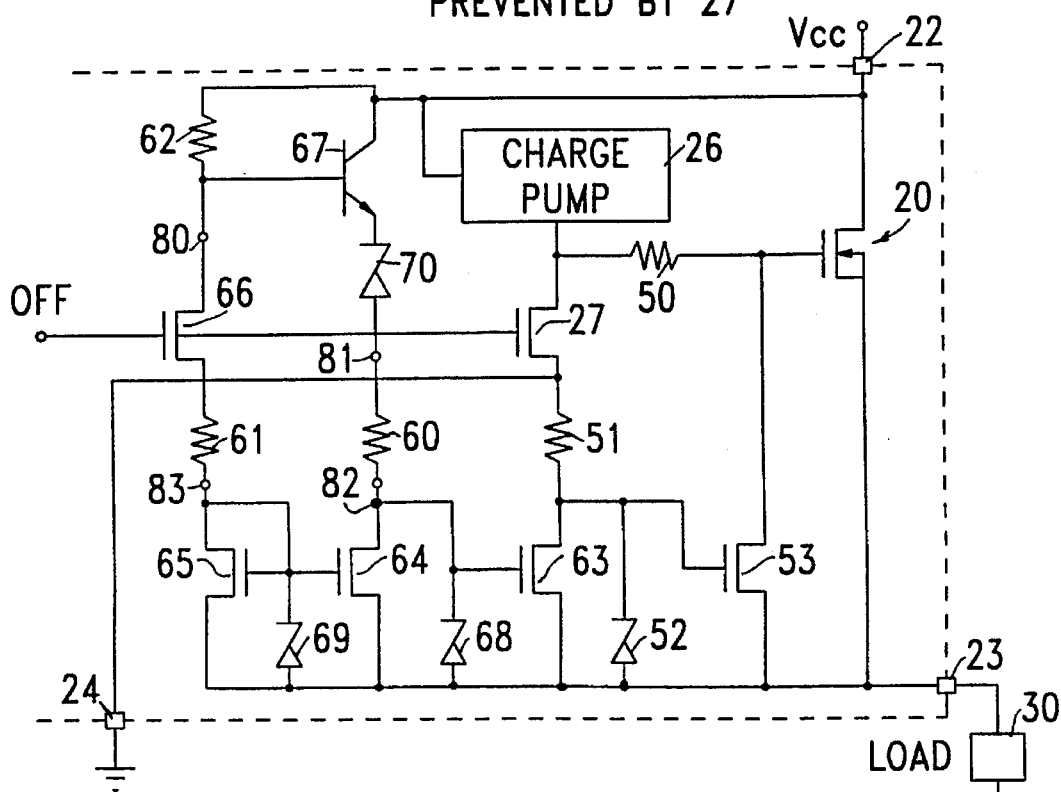
FIG. 6

5,592,117

INTEGRATED MOSGATED POWER SEMICONDUCTOR DEVICE WITH HIGH NEGATIVE CLAMP VOLTAGE AND FAIL SAFE OPERATION

RELATED APPLICATIONS

This application is related to application Ser. No. 08/420,301, filed Apr. 11, 1995, in the name of Bruno Nadd and is assigned to the assignee of the present invention.

BACKGROUND OF THE INVENTION

This invention relates to integrated MOSgated power semiconductor devices, and more specifically relates to a novel circuit which permits rapid turn off of a high side switch which drives a grounded load with low power dissipation for the MOSgated power device.

High side switches employing one or more MOSgated power semiconductor devices with integrated control circuits are well known, such as the IR6000 device manufactured by the International Rectifier Corporation, the assignee of the present invention. When such devices drive an inductive load, as in automotive applications, the MOSgated power device is hard to turn off, and may have to dissipate substantial amounts of power due to inductive current during turn off. Furthermore, when the logic ground for the high side switch is at a different potential than the load circuit ground, the power MOSgated device may be caused to unintentionally conduct and dissipate high power which can destroy the device.

Circuits are known to avoid these problems, but such circuits introduce a new problem, whereby, if the output voltage is below the threshold voltage of that of a control MOSFET which clamps the gate of the main MOSgated power device, the main device cannot be turned on on command.

BRIEF DESCRIPTION OF THE INVENTION

In accordance with the present invention, a novel circuit is provided to control a control MOSFET which connects the gate of the power device to its source or another power electrode in response to a turn-off signal. A level translator circuit couples the input signal to an inverter circuit which, in turn, is coupled to the gate of the control MOSFET to ensure that the control MOSFET can be turned on when the output voltage is negative.

The threshold voltage of the control MOSFET is chosen to be lower than that of the power device and conducts to short the gate of the power device to its source before the power device will conduct, thus preventing the inadvertent turn on of the power device during the turn-off process. A higher negative clamp voltage can then be applied to the circuit to increase di/dt during turn off, to shorten the turn-off time. It is also possible to turn on the power device from an intentional turn-on signal through the use of the level translator circuit which drives the control MOSFET device.

BRIEF DESCRIPTION OF THE DRAWINGS

FIG. 1 is a circuit diagram of a typical prior art monolithic high side switch which has a logic ground connected to a load having a load power ground.

FIGS. 2a, 2b and 2c show the off signal, load voltage and load current respectively on a common time base, for the circuit of FIG. 1, with an inductive load.

FIG. 4b shows the output and gate voltages for the MOSgated power semiconductor device of FIG. 3 on the same time scale as FIG. 4a.

FIG. 5a shows several cycles of the turn-off signal in the circuit of FIG. 3 as a function of time.

FIG. 5b shows the output voltage of the circuit of FIG. 3 on the same time scale as in FIG. 5a and shows the prevention of an intended turn on.

FIG. 6 is a circuit diagram of a preferred embodiment of the present invention, employing a transistor-resistor inverter and a level translation circuit.

DETAILED DESCRIPTION OF THE DRAWINGS

Figure 3:
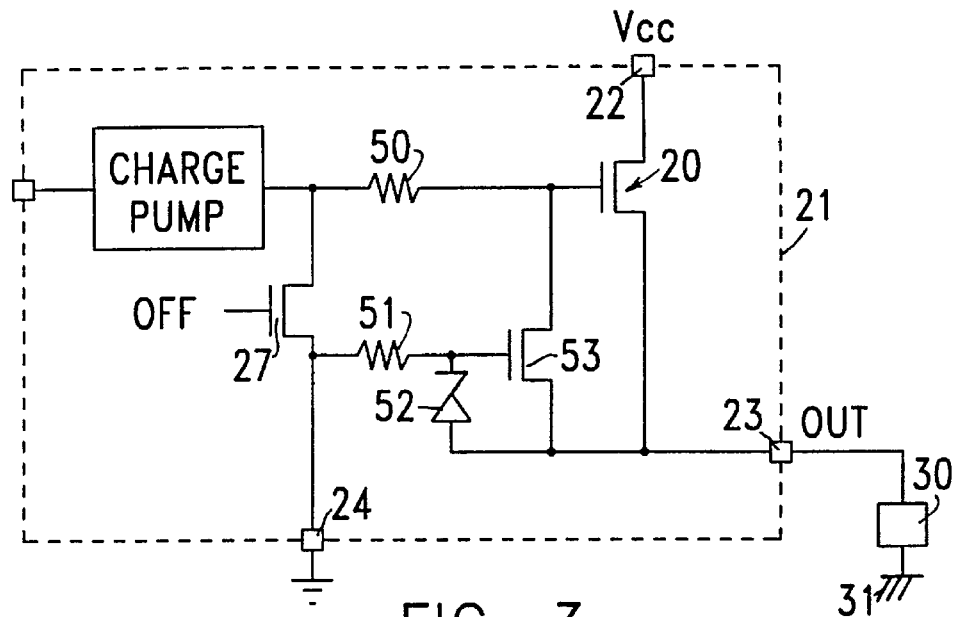
FIG. 3 shows a known modification to the prior art circuit of FIG. 1 which shortens the turn-off time under inductive load and prevents unintended turn on of the MOSgated power semiconductor device due to an offset ground voltage.

Referring first to FIG. 1, there is shown a circuit diagram of the main components of a high side switch formed in a monolithic chip. Thus, an N channel MOSgated power semiconductor device 20 is the main power device and is formed in the same monolithic chip as the control elements. The monolithic chip is then housed in a package 21. The power semiconductor 20 is shown as an N channel power MOSFET, but it could be any other MOSgated type of device such as an IGBT, or the like.

The circuit of FIG. 1 has a $V_{CC}$ input voltage terminal 22 which is connected to the drain of MOSFET 20 and an output terminal 23 connected to the source of MOSFET 20. Terminals 22 and 23 may be terminal pins for the package 21, schematically shown in dotted-line outline, along with a logic ground pin 24 and an input signal pin 25. It should be noted that the voltages described herein relating to the components of package 21 are measured with reference to the logic ground pin 24.

Also contained in the same chip as MOSFET 20 is a conventional charge pump circuit 26, a turn-off N channel MOSFET 27, a logic control circuit 28 and protection circuits 29 which can monitor, for example, voltage, current and temperature conditions of the chip to turn MOSFET 20 off under selected conditions. An input terminal 25 to logic 28 is connected to a user's microcontroller or the like, to turn MOSFET on and off in a given sequence or under certain conditions.

The output terminal 23 is connectible to a load 30 which is connected to its own power ground 31, which is intended to be at the same potential as logic ground terminal 24. Load 30 may typically be an automotive load or the like, operable from the voltage $V_{CC}$ which in the automotive application would be about 12 volts. The charge pump 26 provides a voltage to the gate of power MOSFET 20 which is 5 to 10 volts higher than $V_{CC}$ to make it possible to turn on MOSFET 20.

The auxiliary MOSFET 27 is used to turn off MOSFET 20 by connecting its gate to ground when MOSFET 27 turns on.

The circuit of FIG. 1 has two major problems. The first shows up when load 30 is an inductive load. When driving an inductive load, the output voltage is clamped at turn off of MOSFET 20 to ($-V_{gs}$) where $V_{gs}$ is the gate-to-source voltage of MOSFET 20 during load current conduction. This voltage is typically 3 to 5 volts. The low negative voltage across the load inductance during turn-off results in a low di/dt for the source current and therefore a long time is needed for the current to decay to zero. This results in higher power dissipation in MOSFET 20 and in long response times for the load.

This effect can be seen from FIGS. 2a, 2b and 2c. Thus, the input terminal applies a signal at time $t_1$ to the logic circuit 28 which, in turn, produces the turn-off signal of FIG. 2a (a high signal on the gate of MOSFET 27). MOSFET 27 then turns on at time $t_1$ in FIGS. 2a, 2b and 2c, and the load voltage (FIG. 2b) begins to decay toward ($-V_{gs}$). The load current will now decay slowly (FIG. 2c) until, at time $t_2$, it reaches zero and the load voltage returns to zero.

A second problem arises with the circuit of FIG. 1 when the power ground 31, for example, an automobile chassis, is at a potential different from that of the logic ground 24. This can occur due to parasitic inductances, resistances, corrosion, or accidental disconnection of connectors and the like. This produces an offset voltage, shown schematically in FIG. 1 by battery 40. If, as a result of this offset voltage, the logic ground is more than 1 threshold of the power MOSFET 20 above the power ground 31, the power MOSFET 20 will begin to conduct a high current from $V_{CC}$ terminal 22 to ground 31, and will dissipate high power in MOSFET 20, which can lead to the destruction of the high side switch.

The above-described drawbacks have been avoided through the addition to the circuit of FIG. 1 of a suitable clamping circuit, as shown in FIG. 3. Thus, there is added between charge pump 26 and MOSFET 20 a clamping circuit consisting of resistor 50, resistor 51, zener diode 52 and a second control MOSFET or transistor 53. Transistor 53 is designed to have a lower threshold voltage than that of power MOSFET 20. This known structure is used in the IR 6000 high side switch manufactured by the International Rectifier Corporation, the assignee of this invention.

Figure 4A:
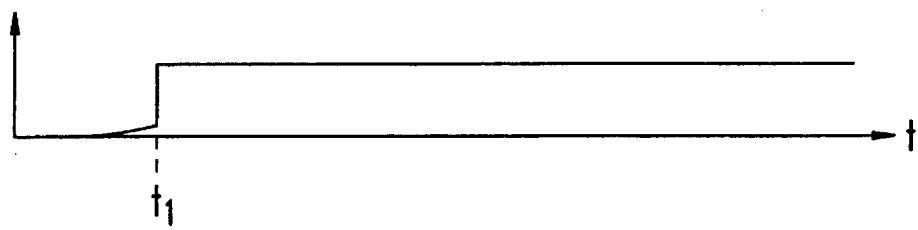
FIG. 4a shows the turn-off signal of the circuit of FIG. 3 as a function of time.

In the circuit of FIG. 3, assume that MOSFET 20 is on and the load 30 is activated. If now the off signal to MOSFET 27 goes high (at time $t_1$ in FIGS. 4a and 4b), MOSFET 27 turns "ON". This discharges the gate of MOSFET 20 to ground and MOSFET 20 turns off. If the load 30 is inductive, or if the power ground 31 is below the logic ground 24, the output voltage at terminal 23 will become negative.

Figure 4B:
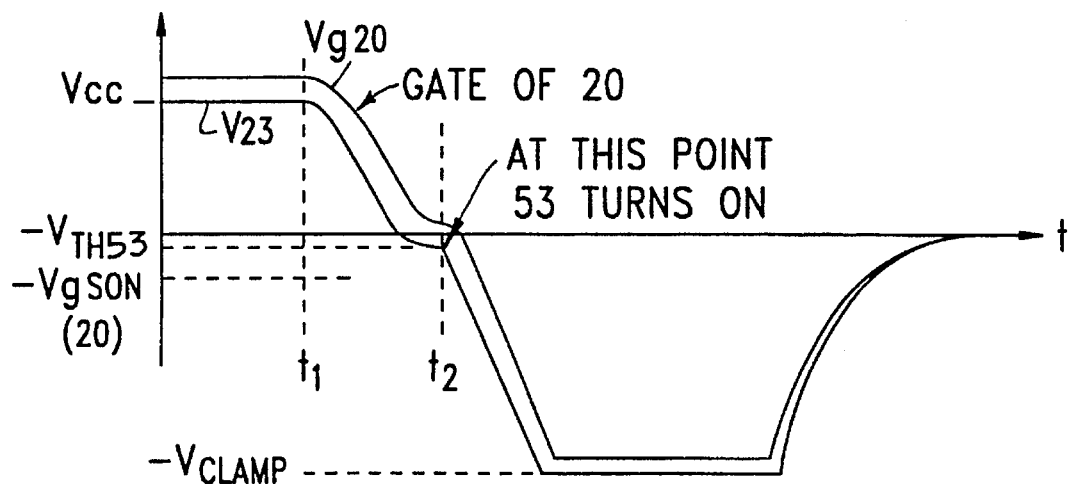

Thus, as shown in FIG. 4b, the source voltage reduces to ($-V_{th(53)}$) (the negative of the threshold voltage of MOSFET 53) so that, at time $t_2$ in FIG. 4b, transistor 53 turns on and connects the gate of MOSFET 20 to its source. Note that this occurs before MOSFET 20 can begin to conduct because MOSFET 53 has a lower threshold voltage than MOSFET 20. As the output voltage becomes more negative, MOSFET 20 stays off because MOSFET 53 is on.

During the above process, resistor 51 and zener diode 52 limit the gate-to-source voltage of MOSFET 53 to a safe value. Resistor 50 limits the current through MOSFET 27.

The actual negative voltage ($-V$ clamp) (FIG. 4b) reached by the output voltage depends on external circuit conditions and may be the value of the ground offset, the avalanche voltage of MOSFET 20 or an internal clamping voltage. This voltage can be much higher than $V_{gson}$ of FIG. 2b and, therefore, will force a higher di/dt than that of FIG. 2c and faster turn off of the switch. The voltage ($-V$ clamp) and the increased di/dt produced thereby are also shown in dotted lines in FIGS. 2b and 2c respectively.

While the prior art circuit of FIG. 3 solves the two problems referred to for the circuit of FIG. 1, it introduces a new problem. Thus, while the output voltage at terminal 23 is below the negative threshold voltage ($-V_{th}$) of MOSFET 53, it is impossible to turn on power MOSFET 20. This action is shown in FIGS. 5a and 5b. FIG. 5a shows the complement of the input signal, as the off signal, applied to the gate of MOSFET 27. In FIG. 5a, the off signal at time $t_1$ goes low to turn off MOSFET 27 and turn on MOSFET 20. However, as discussed in reference to FIG. 4b, the device must wait until the inductive load is totally deenergized before accepting the new turn-on signal at $t_1$ in FIG. 5b and turn on cannot occur until some time after time $t_3$, for example at time $t_4$. It is also impossible to turn on MOSFET 20 if the power ground 31 of FIG. 3 is more than the threshold voltage of MOSFET 53 below the logic ground 24.

The present invention, as disclosed in the circuit of FIG. 6, avoids the above problem while retaining the other advantages of the circuit of FIG. 3. Components of FIG. 6, which are the same as those of FIGS. 1 and 3, have the same identifying numerals and the same function. Added components are resistors 60, 61 and 62, MOSFET transistors 63, 64, 65 and 66, bipolar transistor 67, and zener diodes 68, 69 and 70. Components 60, 61, 63, 64, 65, 68 and 69 act as a level translator for MOSFET 53. Components 62, 66, 67 and 70 act as an inverter for the input off signal, referenced to $V_{CC}$.

The novel circuit of FIG. 6 operates as follows:

If the off signal to transistors 66 and 27 is high, the circuit operates like the circuit of FIG. 3. Thus, transistor 66 will be on and node 80 is low. Further, node 81 is negative by an amount equal to $V_{be}$ of transistor 67 plus the zener voltage of zener diode 70. Transistors 64 and 65 are made to be identical so that the same current will flow in identical resistors 60 and 61 respectively so that resistors 60 and 61 drop the same voltage. Therefore, the potential at node 82 will be lower than that at node 83. Since the gate of transistor 65 is biased close to its threshold voltage $V_{th}$, transistor 63 will be biased below its threshold $V_{th}$ and will be off. Because MOSFET transistor 63 is off, the remainder of the circuit will operate as described for FIG. 3 when the input or off signal is high.

Figure 7A:
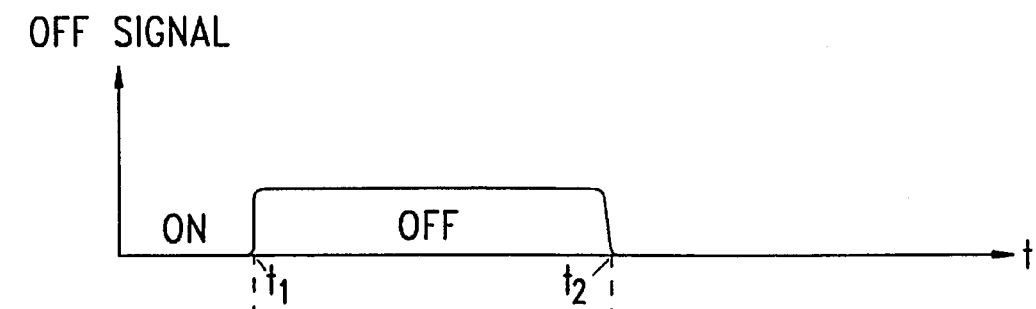
FIG. 7a shows the turn-off signal in the circuit of FIG. 6 as a function of time.
Figure 7B:
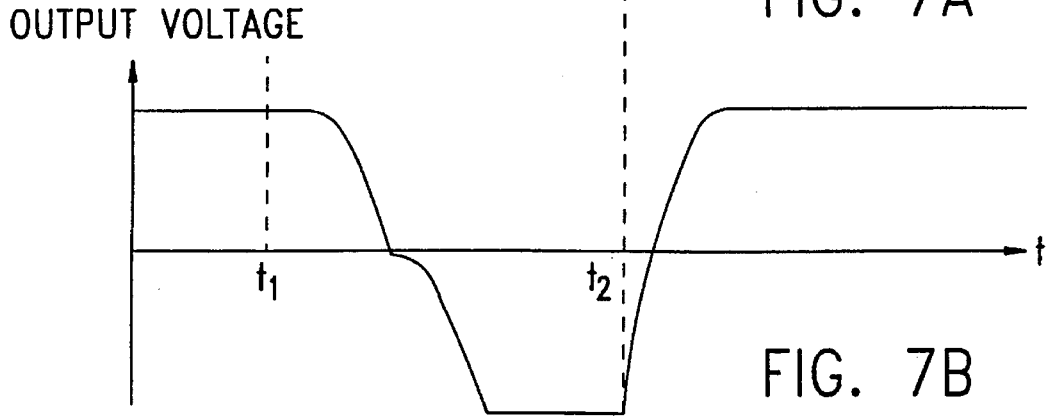
FIG. 7b shows the output voltage of the circuit of FIG. 6 as a function of time.

If now the off signal in FIG. 6 is low, MOSFET 66 is off and node 80 is high. Zener diode 70 has a zener voltage which is lower than [$V_{CC}-V_{be}$ (67)] so that node 81 is positive. Since resistors 60 and 61 drop the same voltage, node 82 will be above node 83. Since the gate of MOSFET 65 is biased close to its threshold voltage $V_{th}$, the gate of MOSFET 63 will be biased above its threshold voltage $V_{th}$ and it will conduct. This will turn off MOSFET 53 to permit turn on of power MOSFET 20, even though the output voltage is below ($-V_{th}$) of MOSFET 53 as shown in FIG. 7a and 7b. Thus, in FIG. 7b, the MOSFET 20 can be turned on at $t_2$, and as soon as the input signal at FIG. 7a goes low. Therefore, the main problem introduced by the circuit of FIG. 3 is avoided.

The circuit of FIG. 6 also provides an added protective function. Thus, if $V_{CC}$ is below $V_{be}$ of transistor 67 plus the zener voltage of zener diode 70, node 81 will go negative whenever the output voltage at terminal 23 goes negative. This keeps power MOSFET 20 off whenever $V_{CC}$ is low and the output voltage is negative. This is a desirable protective feature.

The components of the circuit of FIG. 6 can be easily implemented with N channel MOSFETs and an NPN bipolar transistor. Thus, the circuit can be easily monolithically integrated. Obviously, other components could be chosen for the described functions.

Figure 8:
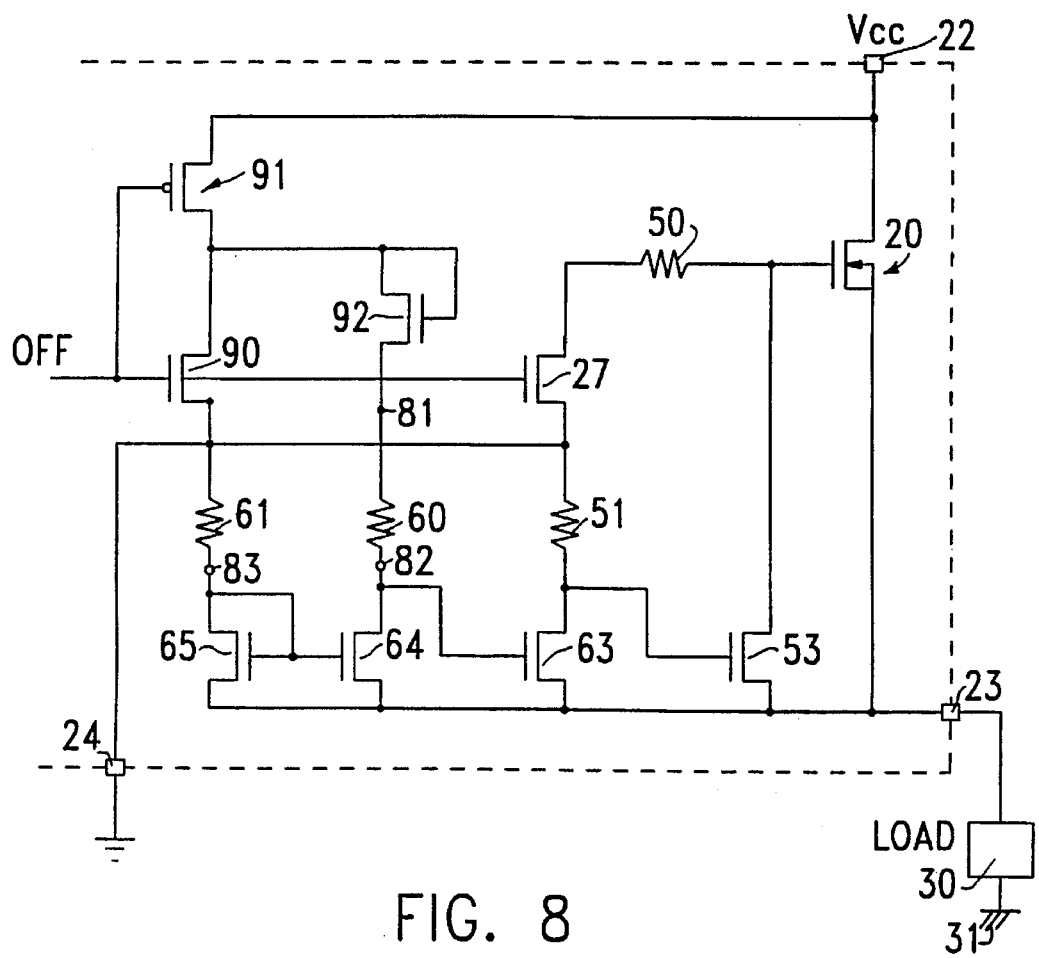
FIG. 8 shows another embodiment of the present invention in which the inverter circuit uses CMOS circuitry.

Another embodiment of the invention is shown in FIG. 8 in which the components having the same structure and function as those of FIG. 6 have the same identifying numerals. The inverter translator receiving the input off signal consists of three MOSFET transistors 90, 91 and 92. These act in such a way that, as was the case of FIG. 6, when the off input is low, node 81 is above the ground potential, and when the off input is high, node 81 is below the ground potential. Therefore, the advantages of the circuit of FIG. 6 are obtained in the circuit of FIG. 8.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high side switch circuit comprising:
   a voltage source ($V_{CC}$) terminal;
   a logic ground terminal;
   an output voltage terminal connectable to one side of a load, the load being connectable at its other side to a load ground terminal;
   a MOSgated semiconductor power device having first and second power electrodes and a control electrode, said first power electrode coupled to said output voltage terminal and said second power electrode coupled to said $V_{CC}$ terminal;
   an input circuit which produces signals for turning said power device off or on;
   a main control MOSFET connected between said first power electrode and said control electrode of said power device for turning off said power device when said main control MOSFET turns on;
   a signal level translator circuit for maintaining a substantially constant control voltage until commutation of said MOSgated semiconductor power device is desired; and
   an inverter circuit, said inverter circuit coupled to said input circuit and said signal level translator circuit, said signal level translator circuit being coupled to said main control MOSFET to turn off said main control MOSFET in response to an input turn-on signal, the threshold conduction voltage of said main control MOSFET being lower than the threshold conduction voltage of said MOSgated semiconductor power device.

2. The circuit of claim 1 wherein said MOSgated power device is a power MOSFET.

3. The circuit of claim 1 wherein said power device and said control MOSFET are N channel devices which are integrated into a common semiconductor chip, and wherein said inverter circuit and translator circuit are also integrated into said common semiconductor chip.

4. The circuit of claim 1, wherein said signal level translator circuit comprises a resistor and a second control MOSFET connected in series and having a node; one end of said resistor connected to said logic ground terminal; one end of said second MOSFET connected to said output voltage terminal; said node between said resistor and said second MOSFET connected to the gate of said main control MOSFET; said substantially constant control voltage being applied to the gate of said second control MOSFET.

5. The circuit of claim 4 which further includes a zener diode connected between the gate of said second control MOSFET and said output voltage terminal.

6. The circuit of claim 4 which further includes third MOSFET coupled between said gate of said power device through a limiting resistor and said logic ground terminal; said input circuit being coupled to the gate of said third MOSFET means.

7. The circuit of claim 1 wherein said translator circuit comprises first and second identical translator MOSFETs and first and second identical translator resistors; said first and second translator MOSFETs being connected in series with said first and second translator resistors respectively; said first and second translator MOSFETs being connected to said output terminal; said first translator resistor being connected to said logic ground terminal; the node between said first translator MOSFET and first translator resistor connected to the gates of said first and second translator MOSFETs; the node between said second translator MOSFET and said second translator resistor connected to the gate of a second control MOSFET; said inverter circuit coupling said second translator resistor to said input circuit.

8. The circuit of claim 7 wherein said inverter circuit includes an inverter MOSFET in series with a pull-up resistor which is connected to said Vcc terminal; the gate of said inverter MOSFET connected to said input circuit; the node between said inverter MOSFET and said pull-up resistor connected to the base of a bipolar transistor; and a zener diode connected between the emitter of said bipolar transistor and said second translator resistor.

9. The circuit of claim 7 which further includes third MOSFET coupled between said gate of said power device through a limiting resistor and said logic ground terminal; said input circuit being coupled to the gate of said third MOSFET.

10. The circuit of claim 7, wherein said inverter circuit includes an inverter MOSFET in series with a pull-up resistor which is connected to said Vcc terminal; the gate of said inverter MOSFET connected to said input circuit; the node between said inverter MOSFET and said pull-up resistor connected to the base of a bipolar transistor; and regulator means connected between the emitter of said bipolar transistor and said second translating resistor.

11. The circuit of claim 7, wherein said inverter circuit includes a first inverter MOSFET; a second inverter MOSFET having an inverting gate terminal; and a third inverter MOSFET, the gates of said first and second inverter MOSFETs being connected, the drain of said second inverter MOSFET being connected to said $V_{CC}$ terminal, the source of said first inverter MOSFET being connected to said logic ground terminal, the source of said second inverter MOSFET being connected to the drains of said first and third inverter MOSFETs, the source of said second inverter MOSFET being further connected to the gate of said third inverter MOSFET, the source of said third inverter MOSFET being connected to said second translator resistor.

\* \* \* \* \*